LOW CAPACITANCE FIELD EFFECT TRANSISTOR
Original Filed Nov. 16, 1965 2 Sheets-Sheet 1
FIG. 1
PRIOR ART
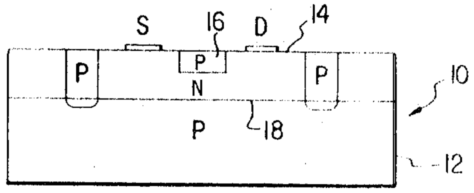
FIG. 2A
FIG. 2B
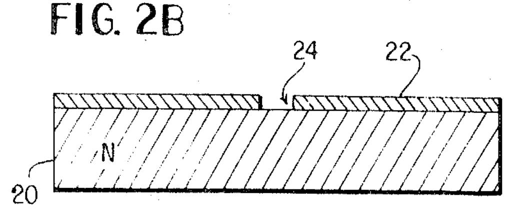
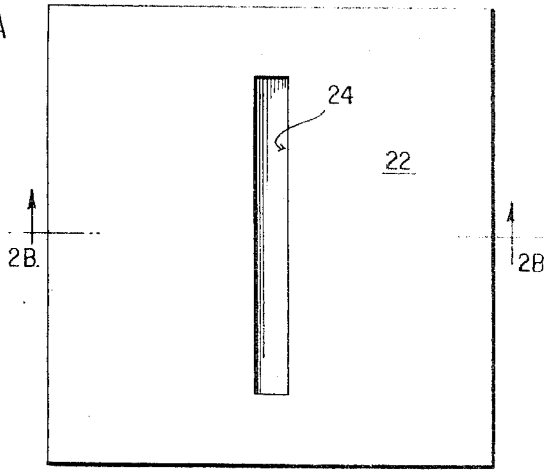
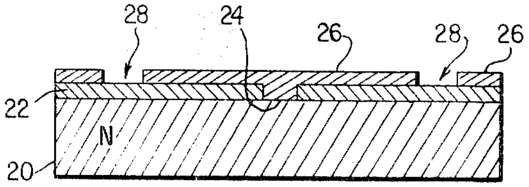
FIG. 3A
FIG. 3B
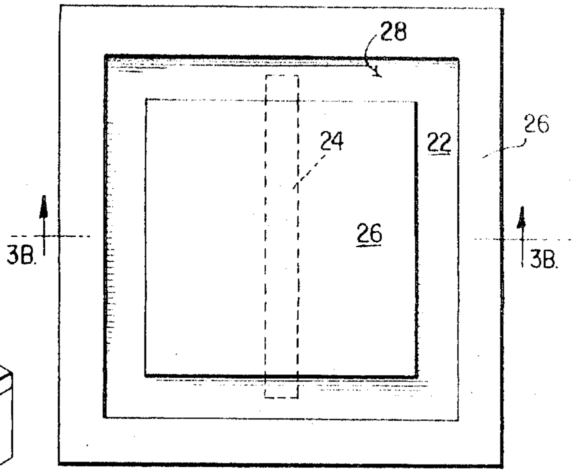
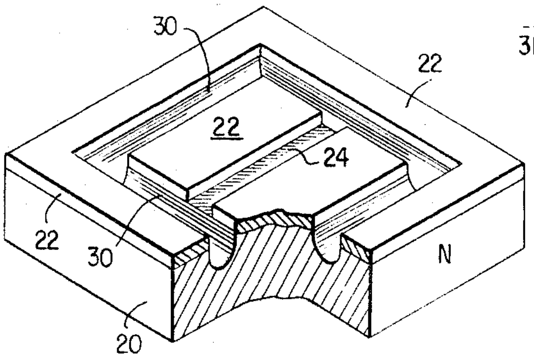
FIG. 4
INVENTOR
RONALD L. KOEPP
BY Sughrue, Rothwell, Mion, Zinn & Macpeak
ATTORNEYS.

LOW CAPACITANCE FIELD EFFECT TRANSISTOR

Original Filed Nov. 16, 1965 2 Sheets-Sheet 2

INVENTOR
RONALD L. KOEPP

BY Sughrue, Rothwell, Mion, Zinn & Macpeak ATTORNEYS.

United States Patent Office 3,597,287

Patented Aug. 3, 1971

3,597,287

LOW CAPACITANCE FIELD EFFECT TRANSISTOR

Ronald L. Koepp, Creve Coeur, Mo., assignor to Monsanto Company, St. Louis, Mo.

Original application Nov. 16, 1965, Ser. No. 508,027, now Patent No. 3,443,172, dated May 6, 1969. Divided and this application Aug. 27, 1968, Ser. No. 775,215
Int. Cl. H01l 7/34
U.S. Cl. 148—187 14 Claims

ABSTRACT OF THE DISCLOSURE

A method of making a field effect transistor by (a) removing a portion of material from a first type conductivity semiconductor substrate to form a continuous groove in the first surface of the substrate, (b) diffusing an impurity into the first surface at selected areas to form, beneath and extending to the surface, an opposite type conductivity region of desired thickness contiguous with the surface of the groove and extending in a channel configuration across the surface area surrounded by the groove, (c) forming a layer of silicon dioxide on the first surface extending down into said groove and forming a thick layer of structural material over the silicon dioxide layer, (d) removing portions of the semiconductor material to form a second surface having a plane which interacts the silicon dioxide layer at the bottom of the groove, (e) diffusing an impurity into the second surface at selected areas thereof to form an opposite conductivity channel extending parallel to the first channel configuration and terminating on both ends at the positions where the plane of the second surface interacts the silicon dioxide layer.

Figures 5, 6, 7, 8B:
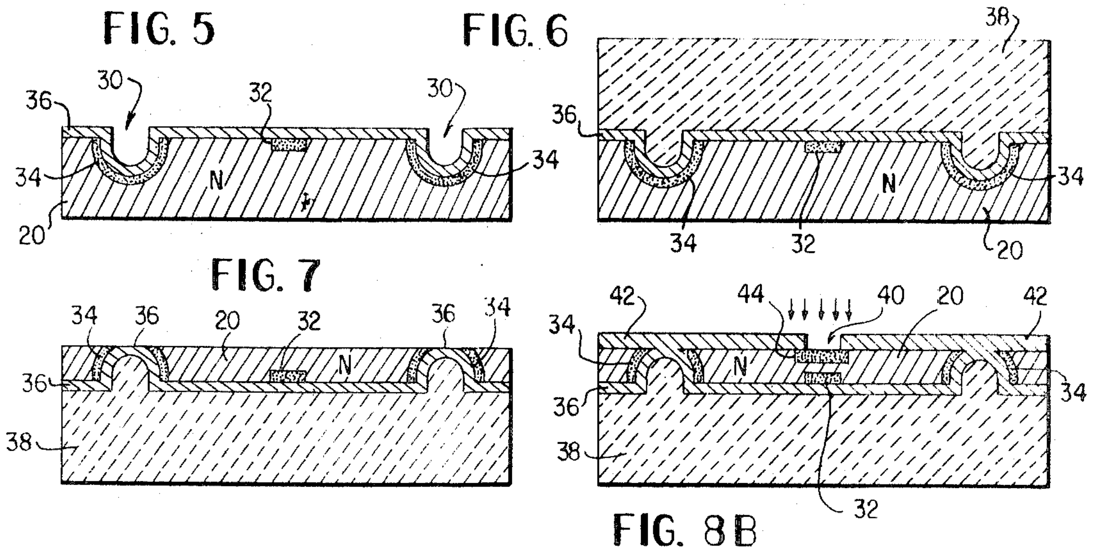

This is a divisional application of Ser. No. 508,027, filed Nov. 16, 1965, now U.S. Patent No. 3,443,172.

This invention relates to new and improved field effect transistors and more particularly to new and improved low capacitance field effect transistors having required size for handling, and methods of fabricating the same.

Field effect transistors, often referred to as unipolar transistors because conduction is by a single carrier rather than by both majority and minority carriers as in other transistors, comprise, generally, a body of semiconductor material such as germanium or silicon having an ohmic connection, usually called a source, and another ohmic connection usually called a drain, at spaced positions on the body. The body itself is of one conductivity, either N or P, and the source and drain are relatively biased to cause a flow of majority carriers from the source to the drain. When the body is of N-type conductivity, the majority carriers are electrons and when the body is P-type, the majority carriers are holes.

Built into the body is a region or zone of conductivity type opposite that of the major portion of the body. This region is disposed adjacent the path of flow of the majority carriers from the source to the drain and is often, referred to as the gate electrode. An ohmic connection, called the gate connection, is made to this region, and this connection is energized so that the PN junction between the gate region and the remainder of the body is biased in the reverse direction. Due to the reverse bias, a space charge region is generated adjacent the junction, the extent of this space charge region into the body being dependent upon the magnitude of the gate potential. The doping of the gate region is preferably higher than the doping of the main body to restrict the space charge region mostly to the main body.

Variations in the extent of the space charge region cause corresponding variations to appear in the cross sectional area of the path available for flow of majority carriers from source to drain. The gate may thus be used to control the flow of current to the drain by affecting a modulation of the resistance of the source-to-drain path.

Field effect transistors as is well known may be used in amplifiers and oscillators. Also, field effect transistors may be used in logic circuits as high speed switches. However, the relatively high inherent capacitance of prior art field effect transistors has prevented their widespread use by circuit designers in high quality high frequency circuits, in counters, A.C. digital voltmeters, and other instruments. The major contribution to the high capacitance in the field effect transistors has been the large PN junction which exists between the bottom gate and the body of the field effect transistor. Although the bottom gate forming the PN junction is relatively large, most of the area does not contribute to the device performance but is only there because a certain size is needed for handling. Thus, merely decreasing the geometry of the overall device does not offer a solution because although the capacitance would be reduced, the device itself would not be large enough for handling.

The present invention overcomes the above-mentioned difficulty by a method of fabrication which results in a very small back gate that is buried into the overall field effect transistor.

It is therefore an object of the present invention to provide a new and improved field effect transistor having relatively low capacitance.

A further object of the present invention is to provide a new and improved method for fabricating field effect transistors.

The foregoing and other objects, features and advantages of the invention will be apparent from the following more particular description of a preferred embodiment of the invention, as illustrated in the accompanying drawings, wherein FIG. 1 is a side view of a prior art field effect transitsor, and FIGS. 2 through 9 are views illustrating several stages in the fabrication of the field effect transistor of the present invention.

A typical prior art field effect transistor 10, as shown in FIG. 1, has source and drain electrodes S and D respectively, a bottom gate 12 and a top gate 16. Current flow in the field effect transistor 10 is between the source and drain through the N-type layer 14. The capacitance of the field effect transistor depends upon the physical size of the device and therefore can be made small be decreasing the device geometry. However, the major contribution to capacitance is the large N-layer to P substrate area, most of which does not contribtue to the device performance but is only there between a certain size is necessary for handling. Consequently, although reducing the overall geometry of the device 10, will reduce the area of junction 18 and thereby reduce the device capacitance, the P-layer 12 which serves both as the back gate and the substrate will become too small for handling.

In the present invention, the junction between the semiconductor layer forming the current path and the back gate is made very small without the sacrifice of overall device geometry. The method for fabricating the field effect transistor of the present invention will be explained with reference to FIGS. 2–9, which illustrate the different stages in the development of the final product.

Before commencing a description of the new method, it should be understood that the materials referred to are not critical and in themselves form no part of the present invention. For example, although the description will be explained with reference to a silicon field effect transistor having an N-type body and P-type gates, the invention pertains equally as well to silicon field effect transistors having P-type bodies and N-type gates, and also to field effect transistors made from other types of semiconductor material. Also, the impurity used to form the diffused junctions is a matter of engineering choice and it is not critical that boron be used, as described in the method below. For ease of explaining and understanding the present invention, the making of only a single field effect transistor will be described. However, it will be apparent to those skilled in the art, that a plurality of field effect transistors may be made simultaneously from a large substrate by the techniques to be described below, followed by separation of the individual transistors by methods well known in the transistor manufacturing art.

Referring to FIG. 2 there is shown a layer of N-type silicon which is the starting material and which will serve as the body of the finished field effect transistor. The silicon semiconductor layer 20 is polished and then exposed to an oxygen atmosphere for the formation of a thin oxide layer on the upper surface thereof.

As an example, the N-type silicon may be placed in a tube type furnace at 1200° C., and an atmosphere of wet oxygen passed over it for three hours. An oxide thickness of about 4000–7000 A. will be produced on the wafers. Other methods for producing an oxide coating on the upper surface of a semiconductor wafer are well known and will not be discussed herein.

A channel 24 is cut into the oxide layer 22 thereby exposing a thin strip area of the semiconductor upper surface. The removal of the oxide from the desired surface area may be accomplished by numerous methods, well known in the art. A preferred method is to coat the oxide surface with any one of a group of well known photo-resist materials. Conventional methods of applying such a coating may be employed such as brushing, dipping, spraying, or the like which may be followed by a whirling operation to insure uniform and thin resist layers. It is important, that before applying a resist material, a suitable cleaning agent such as benzene, toluene, or like solvents are used to insure a clean surface. The resist is then removed in part over the desired area of the oxide by applying photographically a pattern to the resist surface and developing the same by means well known in the art. The development thus removes the resist from the desired areas exposing portion of the oxide, and the exposed oxide may then be removed from the upper surface of the semiconductor substrate by the use of a suitable etchant, e.g. solution of ammonium bifluoride.

The remaining resist may be removed by any number of suitable solvents, e.g. cellulose acetate, leaving an oxide mask 22 over the upper surface of the semiconductor substrate, as shown in FIG. 2.

The next step in the process of fabrication is to form a groove in the semiconductor substrate which surrounds the area 24. An intermediate step in forming the groove is shown in FIG. 3 wherein a mask 26 of photo-resist material overlies oxide layer 22. The photo-resist material has been removed, as indicated in FIG. 3, from areas, 28, by methods such as those described above. The grooves are formed by applying an etchant solution to the upper surface of the device shown in FIG. 3B. The portions covered by the photo-resist are protected from the etchant solution, but the unprotected areas are in effect scooped out forming a U-shaped groove having a surface geometry corresponding to area 28. The etchant may be a solution of three parts nitric acid to one part hydrofluoric acid to produce grooves of approximately 0.5 mil. The photoresist coating 26 is then removed, leaving an oxide coating 22 in the form of a mask covering all of the semiconductor surface except the strip area 24 and the grooves 30, as shown by the sectional perspective drawing of FIG. 4.

After the latter step, the device is ready for formation of the bottom P-type gate. The P-type sections are formed by vapor diffusion through the upper surface areas left unprotected by the oxide coating, as is well known in the art. A typical method is to place the device in a tube furnace at about 1200° C. and subject it to an atmosphere of boron for about 10 minutes. This produces a shallow lightly doped P-type junction such as that shown by 32 and 34 in FIG. 5. The diffused P-type section 32 has a surface geometry which is substantially identical to that of channel 24, and will serve as the bottom gate for the completed field effect transistor.

After the latter diffusion, the entire upper surface including the inside surface of the grooves 30 is again covered by an oxide layer. As a typical example, the oxide layer may be formed by placing the device in an oxidizing atmosphere of steam at 1100° C. to produce an oxide layer of about 8000–10,000 A.

A deposition of polycrystalline silicon, about 5 to 6 mils thick, over the oxide layer follows, forming the structural layer 38 shown in FIG. 6. The purpose of the structural layer 38 is to provide the size necessary for handling of the completed device. Methods for depositing polycrystalline silicon are well known in the art. One typical method comprises placing the device in a reaction chamber which consists of a long cylindrical quartz tube with inlet and outlet at opposite ends. An RF induction coil encircles the cylindrical tube and a long rectangular graphite rod (called a boat) is placed within the reaction chamber, where the graphite can be heated inductively to about 1200° C. The boat is encased by a quartz sleeve upon which the wafers which are to receive the silicon deposition are placed. A wide variety of gases, such as $N_2$, $H_2$, $H_{2+}SiCl_4$, $H_{2+}PH_3H_{2+}B_2H_6$, and HCl, are introduced into the chamber by means of a branched inlet. The basic chemical reaction for the production of the polycrystalline silicon is the hydrogen reduction of silicon tetrachloride:

$$SiCl_4+2H_2 \overset{1200°C}{\rightleftarrows} Si+4HCl$$

The device is then turned over, as shown in FIG. 7, and the upper surface of the N-type silicon layer is lapped and polished until the oxide 36 at the apex of the U-shaped groove is exposed to the surface. The oxide 36 at the upper surface completely surrounds the surface area of semiconductor 20. The upper P-type gate is then formed by methods similar to that described above. For example, an oxide coating is placed over the upper surface of the device and removed from desired areas forming a pattern 40, shown in FIG. 8, by photoetching techniques. The upper P-type gate 44 is formed by diffusing an impurity through the surface areas of the semiconductor, 20, left unprotected by the oxide layer 42. Typically, the P-type upper gate may be formed by subjecting the device to a boron atmosphere at 1,023° C.

Figures 8A, 9A, 9B, 9C:
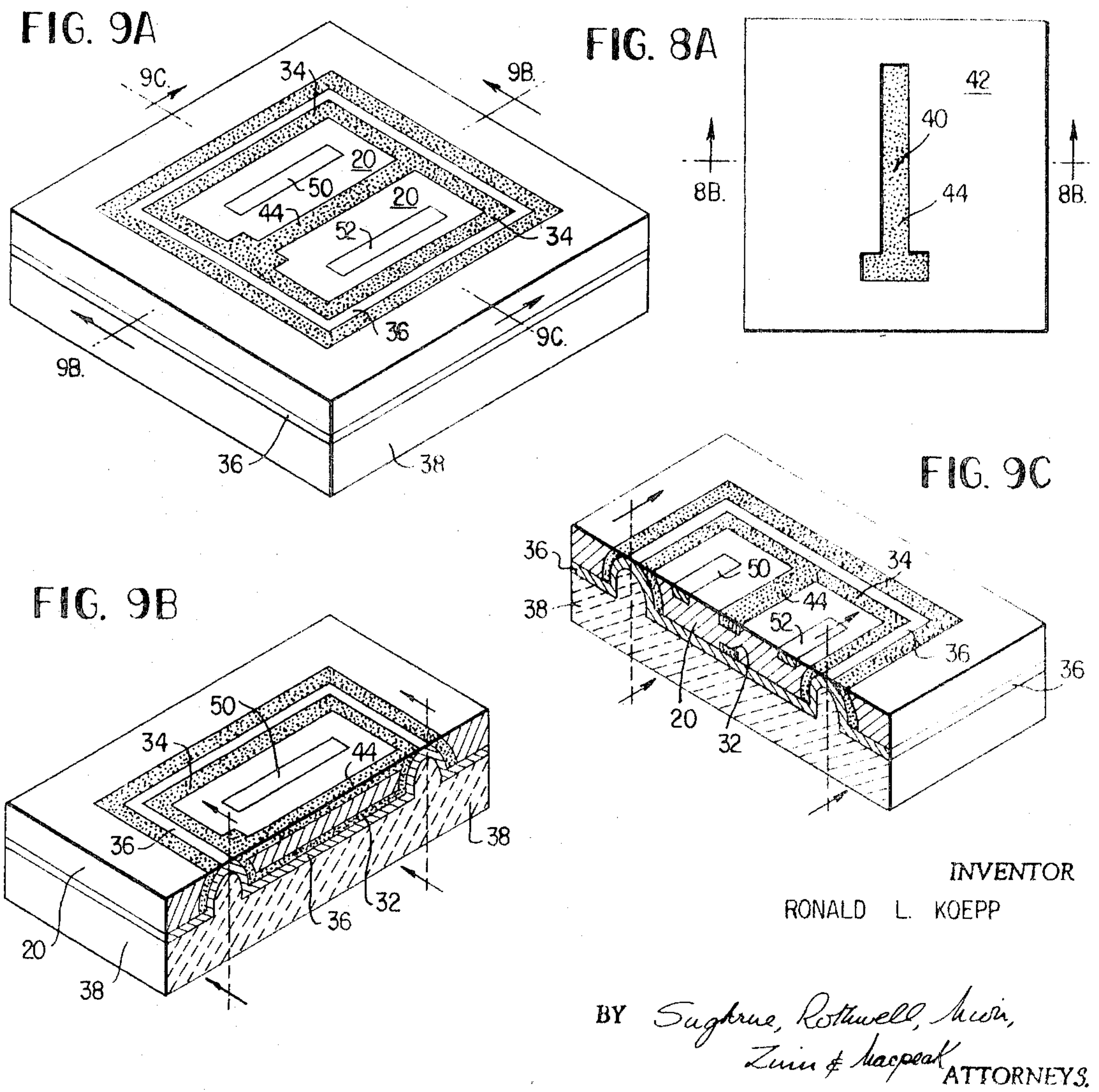

The shape of the upper P gate 44 as shown in FIGS. 9A through 9C is that of a very narrow strip with a widened portion at one end. In the fabrication of field effect transistors it is desirable to provide such a narrow, strip-like upper gate but external electrical contact to such a narrow strip is not practical. However, the wider portion at one end of the gate 44 does provide sufficient contact area. It should be noted that when formation is complete, the upper P-type gate 44 and the lower P-type gate 32 are connected together at their ends by the P-type zone 34. Thus, electrical continuity is provided between the upper and lower P-type gates, and it is only necessary to provide an external contact to the upper gate 44. However, it should be noted that separate control for each gate may be employed where electrical continuity between them is broken and this may easily be done by providing separate contacts for each gate.

The function of the P-type regions 34, which are formed integrally with the bottom gate 32, aside from providing electrical continuity between the upper and lower gates, is to isolate the N-type channel, which is the current conducting path of the FET, from other active elements which are or may be fabricated adjacent to the field effect transistor on the same substrate. Their control function when compared with that of the lower gate 32, is insignificant.

After the upper P-type gate 44 is formed, the oxide coating 42 is removed to allow the formation of the contacts 50 and 52, shown in FIGS. 9A through 9C, which serve as the source and drain electrodes respectively.

Several different contact materials may be used; e.g., gold, nickel, lead silver, or chromium. However, aluminum contacts are preferable. After the oxide coating 42 has been removed by the conventional photo-resist technique in those areas where only contacts are to be formed, the contact areas are cleaned and the wafer placed in a high-vacuum bell-jar system. The clean, etched wafers are placed under a tungsten filament in the bell-jar and the ohmic-contact metal, e.g., aluminum, is coiled around the tungsten filament. After the bell-jar has been evacuated, the aluminum is vaporized by the heated filament and deposited in a thin film on the wafer. The bell-jar is then backfilled and the wafer removed. The metallized wafer is then coated or masked with photo-resist, exposed with a new mask which is essentially the inverse of the preceding mask, and developed. At this point, an appropriate etch such as sodium hydroxide or a solution of 20% KOH is used to remove the aluminum from the unwanted areas. The photo-resist is then cleaned from the deposited aluminum and the metal alloyed into the surface of the semiconducted material by heating.

The resulting field effect transistor, which is shown in FIGS. 9A through 9C has a very small gate-body junction area resulting in a substantially reduced transistor capacitance. At the same time, a substrate 38 which has no effect on the device capacity gives the overall device sufficient size for handling capabilities. In actual practice, if a plurality of field effect transistors are made simultaneously from a large substrate, in accordance with the method described above, the individual field effect transistors would be separated by slicing along the apex of the U-shaped groove as indicated by the dotted lines in FIGS. 9C and 9B.

While the invention has been particularly shown and described with reference to a preferred embodiment thereof, it will be understood by those skilled in the art that various changes in form and details may be made therein without departing from the spirit and scope of the invention.

What is claimed is:

1. A method for forming a low capacitance field effect transistor comprising the steps of (a) removing a portion of material from a first type conductivity semiconductor substrate to form a continuous groove in the first surface of said substrate, (b) diffusing an impurity into the first surface at selected areas to form, beneath and extending to said surface, an opposite type conductivity region of desired thickness contiguous with the surface of said groove and extending in a channel configuration across the surface area surrounded by the groove, (c) forming a layer of silicon dioxide on the first surface extending down into said groove and forming a thick layer of structural material over said silicon dioxide layer, (d) removing portions of said semiconductor material to form a second surface having a plane which intersects said silicon dioxide layer at the bottom of said groove, (e) diffusing an impurity into the second surface at selected areas thereof to form an opposite conductivity channel extending parallel to said first channel configuration and terminating on both ends at the positions where the plane of said second surface intersects the silicon dioxide layer.

2. The method claimed in claim 1 further comprising the step of forming two ohmic contacts to the second surface within the area surrounded by the groove and on both sides of said channel.

3. The method claimed in claim 2 further comprising the step of forming an ohmic contact to said channel.

4. The method claimed in claim 3 wherein said semiconductor substrate is P-type silicon.

5. The method claimed in claim 3 wherein said semiconductor substrate is N-type silicon.

6. The method claimed in claim 3 wherein said semiconductor is P-type germanium.

7. The method claimed in claim 3 wherein said semiconductor substrate is N-type germanium.

8. The method claimed in claim 3 wherein the steps of removing a portion of material to form a groove and diffusing an impurity comprise the steps of (a) polishing the first surface of a silicon substrate of N-type conductivity, (b) oxidizing said first surface to form a first layer of silicon dioxide, (c) removing a portion of said silicon dioxide layer to expose a channel area of said first surface of a desired length, (d) forming a mask of photographic-resist material on top of said first layer of silicon dioxide and covering said exposed channel area, said mask having a configuration which exposes a continuous width of said first layer of silicon dioxide surrounding said channel area and being contiguous to the ends of said channel area, (e) exposing said exposed continuous width to an etching solution for a period of time sufficient to remove the exposed silicon dioxide and form a groove of U-shaped cross-section in said first surface having edges which meet said first surface at the edges of said photographic-resist mask defining said continuous width, (f) removing said mask, (g) subjecting said first surface of the silicon semiconductor to an atmosphere of a vaporized acceptor material for a period of time sufficient to diffuse P-type layers of desired thickness into said silicon through surfaces not covered by said first layer of silicon dioxide.

9. The method claimed in claim 8 wherein said structural material is a layer of polycrystalline silicon having a thickness of approximately 5 to 6 mils and said layer of silicon dioxide over which said polycrystalline silicon is formed is approximately 8 to 10,000 A. thick.

10. The method as claimed in claim 9 wherein the step of removing portions of said semiconductor material to form a second surface comprises lapping the side of said silicon substrate opposite to said first surface and polishing same until the apex portion of the U-shaped groove is exposed thereby forming a second substrate surface surrounded by a small width of silicon dioxide.

11. The method as claimed in claim 10 wherein the channel formed in the second surface is of T-shaped dimensions, being wider at one end than at the other.

12. The metdod claimed in claim 3 wherein the steps of removing a portion of material to form a groove and diffusing an impurity comprises the steps of (a) polishing the first surface of a silicon substrate of P-type conductivity, (b) oxidizing said first surface to form a first layer of silicon dioxide, (c) removing a portion of said silicon dioxide layer to expose a channel area of said first surface of a desired length, (d) forming a mask of photographic-resist material on top of said first layer of silicon dioxide and covering said exposed channel area, said mask having a configuration which exposes a continuous width of said first layer of silicon dioxide surrounding said channel area and being contiguous to the ends of said channel area, (e) exposing said exposed continuous width to an etching solution for a period of time sufficient to remove the exposed silicon dioxide and form a groove of U-shaped cross-section in said first surface having edges which meet said first surface at the edges of said photographic-resist mask defining said continuous width, (f) removing the mask, (g) subjecting said first surface of the silicon semiconductor to an atmosphere of a vaporized donor material for a period of time sufficient to diffuse N-type layers of desired thickness into said silicon through surfaces not covered by said first layer of silicon dioxide.

13. A method for forming a low capacitance field effect transistor comprising the steps of (a) polishing the upper surface of said semiconductor slice of a first conductivity, (b) oxidizing the upper surface of said semiconductor slice to form $SiO_2$ coating on surface, (c) removing a narrow strip of the $SiO_2$ coating, (d) covering the upper surface of said semiconductor slice with the $SiO_2$ thereon with a photo-resist material and removing selected portions of said resist defining a closed path of $SiO_2$ material which encompasses said narrow strip and intersects the ends thereof, (e) removing the exposed $SiO_2$ and a portion of semiconductor thereunder to form a continuous groove in the semiconductor material, (f) removing the remaining resist from the surface of the semiconductor, (g) diffusing an opposite type conductivity material into the exposed upper surface of the semiconductor material, (h) oxidizing the entire upper surface and forming a layer of nonconducting structural material over said oxide coating, (i) removing portions of the semiconductor to form a bottom surface having a plane which intersects the bottom of said groove (j) providing the bottom surface with a coating of $SiO_2$ with the exception of a T-shaped area, the stem of which lies parallel to the narrow strip in the upper surface and intersecting the bottom of said groove at each end, (k) diffusing a P-type material into the T-shaped area of the bottom surface, (l) forming two metallic contacts on the bottom surface of said stem and within the area defined by said groove.

14. A method for fabricating low capacitance field effect transistors comprising the steps of (a) polishing a semiconductor substrtae formed of N-type conductivity silicon having a thickness of about 7 to 9 mils, (b) placing said substrate in a furnace at elevated temperatures and passing an atmosphere of wet oxygen over a first surface of the substrate for about 3 hours to form a first layer of oxide on said first surface having a thickness of about 4000 to 7000 A., (c) coating said first layer of silicon dioxide with a photo-resist material and exposing a thin strip of the photo-resist, developing same, and etching the exposed silicon dioxide forming a thin channel of exposed surface of the silicon, (d) recoating the first layer of silicon dioxide and the thin strip of exposed surface with a photo-resist and removing a portion of the photo-resist to expose a small width of the silicon surface having the geometry of a closed path which surrounds and intersects at the ends thereof said thin strip, (e) etching the surface areas uncovered by the photo-resist in a solution of 3 parts $HNO_3$:1 part $H_1F$ to produce grooves having U-shaped cross section and extending into the first surface about 0.5 mil, (f) removing the remaining photo-resist, (g) subjecting the first surface of the silicon semiconductor to an atmosphere of boron for about 10 minutes to form P-type layers of desired depths into said silicon through surfaces not covered by said first layer of silicon dioxide, (h) reoxidizing the first surface of said silicon substrate including the inner surfaces of said groove to produce an oxide coating of about 8,000 to 10,000 A. thick, (i) depositing polycrystalline silicon over said oxide coating forming a layer thereof about 5 to 6 mils thick, (j) lapping the silicon semiconductor on the side opposite to said first surface and polishing same until the oxide coating at the apex of the U-shaped groove is exposed thereby forming a second surface of the silicon substrate outlined by an exposed thin continuous strip of silicon dioxide, (k) forming a mask of silicon dioxide over said second surface, said mask covering all but a T-shaped area of the second surface wherein the stem of the T is substantially parallel to said thin channel and the T-shape area touches the continuous strip of oxide at the bottom of the stem and at the top of the bar, (l) subjecting the second surface of the silicon semiconductor to an atmosphere of boron to form a P-type layer of desired depth into the silicon through the T-shaped exposed surface, (m) removing the oxide and forming two metal contacts to the second surface, one in each side of the T stem and within the area surrounded by the continuous strip, and (n) forming an ohmic contact to the P-type T-shaped layer.

References Cited

UNITED STATES PATENTS

| | | | |
|---|---|---|---|
| 3,344,322 | 9/1967 | Dill | 317—235 |
| 3,349,306 | 10/1967 | Koepp et al. | 317—235 |
| 3,358,195 | 12/1967 | Onodera | 317—235 |
| 3,372,316 | 3/1968 | Teszner | 317—235 |
| 3,381,187 | 4/1968 | Zuleeg | 317—235 |

L. DEWAYNE RUTLEDGE, Primary Examiner

R. A. LESTER, Assistant Examiner

U.S. Cl. X.R.

148—186; 317—235